United States Patent
Hikida

(10) Patent No.: US 9,012,301 B2
(45) Date of Patent: Apr. 21, 2015

(54) METHOD OF MANUFACTURING A SEMICONDUCTOR APPARATUS AND ELECTRONIC EQUIPMENT

(75) Inventor: Satoshi Hikida, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/824,206

(22) PCT Filed: Sep. 9, 2011

(86) PCT No.: PCT/JP2011/005079
§ 371 (c)(1),
(2), (4) Date: Mar. 15, 2013

(87) PCT Pub. No.: WO2012/035731
PCT Pub. Date: Mar. 22, 2012

(65) Prior Publication Data
US 2013/0183807 A1      Jul. 18, 2013

(30) Foreign Application Priority Data
Sep. 16, 2010   (JP) .................................. 2010-208574

(51) Int. Cl.
| | |
|---|---|
| *H01L 21/76* | (2006.01) |
| *H01L 21/762* | (2006.01) |
| *H01L 21/8238* | (2006.01) |
| *H01L 21/8234* | (2006.01) |

(52) U.S. Cl.
CPC .. *H01L 21/76224* (2013.01); *H01L 21/823857* (2013.01); *H01L 21/823878* (2013.01); *H01L 21/823462* (2013.01); *H01L 21/823481* (2013.01)

(58) Field of Classification Search
CPC ................. H01L 21/76224; H01L 21/823878; H01L 21/823481
USPC ........................................... 438/424, 400, 435
See application file for complete search history.

(56) References Cited

U.S. PATENT DOCUMENTS 6,380,020 B1 *   4/2002   Shimizu ........................ 438/225
6,566,207 B2 *   5/2003   Park .............................. 438/296

(Continued)

FOREIGN PATENT DOCUMENTS

| JP | 11-340456 A | 12/1999 |
|---|---|---|
| JP | 2001-160589 A | 6/2001 |

(Continued)

OTHER PUBLICATIONS

International Search Report, mailed Dec. 13, 2011, issued in PCT/JP2011/005079.

*Primary Examiner* — Bradley K Smith
(74) *Attorney, Agent, or Firm* — Birch, Stewart, Kolasch & Birch, LLP

(57) ABSTRACT

In the method of manufacturing a semiconductor apparatus of the present invention, after forming trench isolation regions 100c, 100f, and 100g on a surface of a semiconductor substrate 101 so as to isolate element regions on which the semiconductor elements are to be formed, a silicon nitride film (antioxidant film) 109 is formed so as to cover the trench isolation regions and to stick out from the trench isolation regions with partially overlapping element regions adjacent to the trench isolation regions, and a thermal oxide film 110 that is thicker than a thermal oxide film required in a semiconductor element of a predetermined size among a plurality of semiconductor elements, is formed on the element region using the antioxidant film as a mask.

8 Claims, 10 Drawing Sheets

(56) References Cited

U.S. PATENT DOCUMENTS

2001/0041421 A1 11/2001 Park et al.
2008/0246073 A1* 10/2008 Lee et al. .................. 257/314

FOREIGN PATENT DOCUMENTS

| JP | 2002-222942 A | 8/2002 |
| JP | 2010-27688 A | 2/2010 |

* cited by examiner

FIG. 9
(a) 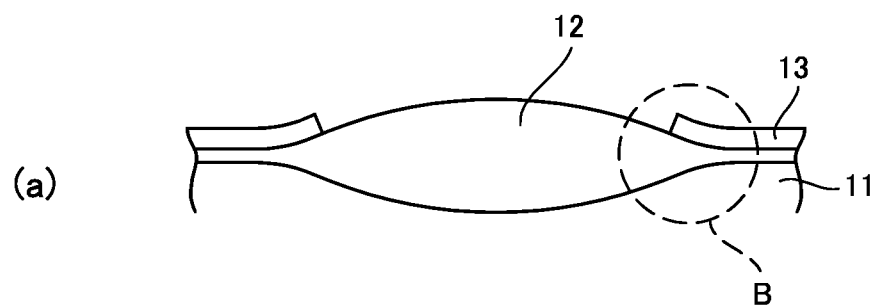
(b) 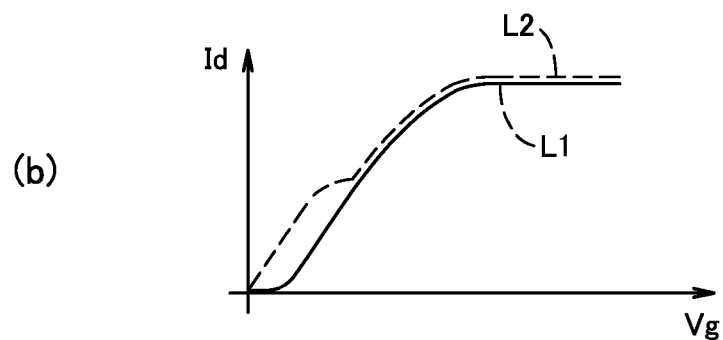

METHOD OF MANUFACTURING A SEMICONDUCTOR APPARATUS AND ELECTRONIC EQUIPMENT

TECHNICAL FIELD

The present invention relates to a method of manufacturing a semiconductor apparatus and electronic equipment, and especially to a method for manufacturing a semiconductor apparatus using a trench isolation structure as the structure for isolating an element region formed on a semiconductor substrate, and electronic equipment equipped with the semiconductor apparatus manufactured by this method.

BACKGROUND ART

Inter-element isolation techniques of a semiconductor apparatus are roughly divided into the local oxidation of silicon method (hereinafter, referred to as a LOCOS method) and the trench element isolation method.

FIG. 6 is a diagram illustrating a conventional semiconductor apparatus. FIGS. 6(a) and 6(b) are a plane view and a cross-sectional view (X-X line cross-sectional view of FIG. 6(a)) showing transistors isolated by an element isolation region formed by the LOCOS method.

In this semiconductor apparatus 10, adjacent element regions 10a and 10b are isolated by a field oxide film 12 that forms an element isolation region 10c.

For each of the element regions 10a and 10b, a gate electrode 17 is formed with a gate insulating film 16 interposed therebetween. On both sides of the gate electrode 17, a source region 15a and a drain region 15b are formed.

FIG. 7 is a diagram illustrating a method of manufacturing a conventional semiconductor apparatus using the LOCOS method in the order of the steps (FIGS. 7(a)-7(c)).

First, a thermal oxide film 12a is formed on a silicon substrate, and a nitride film 13 having an opening at a portion to be the element isolation region 10c of the silicon substrate 11 is formed (FIG. 7(a)).

Next, a field thermal oxide film 12 is formed in the element isolation region 10c positioned between the element regions 10a and 10b by thermal oxidation processing, using the nitride film 13 as a mask (FIG. 7(b)).

Subsequently, after the above-described nitride film 13 is removed, the gate insulating film 16 and the gate electrode 17 are formed in the element regions 10a and 10b. Further, the source region 15a and the drain region 15b are formed on both sides of the gate electrode 17.

FIG. 6(c) is a cross-sectional view showing a structure in which element regions are isolated by an element isolation region formed by the trench isolation method, in a conventional semiconductor apparatus, and shows the portion corresponding to the X-X line cross-section of FIG. 6(a).

In this semiconductor apparatus 20, adjacent element regions 20a and 20b are isolated by a trench isolation section that is used as an element isolation region 20c.

Here, the trench isolation section has a structure in which an isolator 24 is embedded in a trench groove formed on a silicon substrate 21 with a thermal oxide film 22 interposed therebetween. Further, in each of the element regions 20a and 20b, a gate electrode 27 is formed with a gate insulating film 26 interposed therebetween, and a source region 25a and a drain region 25b are formed on both sides of the gate electrode 27.

FIG. 8 is a diagram illustrating a method of manufacturing a conventional semiconductor apparatus using the trench isolation method, in the order of the steps (FIGS. 8(a)-8(d)).

First, a thermal oxide film 28 is formed on the silicon substrate 21, and a nitride film 29 having an opening at a portion that is to be an element isolation region of the silicon substrate 21 is formed (FIG. 8(a)).

Next, the thermal oxide film 28 and the silicon substrate 21 are etched to form a trench groove 21a, with the nitride film 29 as an etching mask (FIG. 8(b)). Subsequently, after a thermal oxide film 22 is formed on the inner surface of the trench groove 21a, a dielectric 24 is embedded in the trench groove 21a to form the element isolation region 20c (FIG. 8(c)). The nitride film 29 is used as an etching stopper upon etching the dielectric 24 formed on the entire surface, in a process of embedding the dielectric 24 in the trench groove 21a. The nitride film 29 is removed after the formation of the trench isolation region 20c.

Next, after removing the thermal oxide film 28, the gate insulating film 26 and the gate electrode 27 are formed in the element regions 20a and 20b. Furthermore, the source region 25a and the drain region 25b are formed on both sides of the gate electrode 27 (FIG. 8(d)).

The LOCOS method described above is for forming an element isolation region by thermally oxidizing a surface region of a silicon substrate selectively, and the formation processing of an element isolation region is simply a selective thermal oxidation. However, as illustrated in FIG. 9(a), it has a shortcoming in that a bird's beak B is formed on the side section of an element isolation region, and the width of element regions, which are to be a source region and a drain region, cannot be controlled accurately. In FIG. 9(a), the symbol 12 denotes a field oxide film formed on the silicon substrate 11 and symbol 13 denotes a nitride film used as a mask for forming the field oxide film 12.

On the other hand, the trench isolation method is for forming an element isolation region by selectively forming a trench on a surface region of a silicon substrate and filling the inside of the trench with an insulating material such as an oxide. In comparison to the above-described LOCOS method, in the trench isolation method, it is possible to form a small element isolation region with high precision and the trench isolation method is suitable for forming an element isolation region for isolating fine element regions.

By the way, there is a trend of a drastic increase in the number of elements mounted in a semiconductor apparatus in recent years with a shift towards high performance and high function semiconductors. In order to materialize such semiconductors, fine processing techniques are needed, and for processing rules for 0.25 um or less, the trench isolation technique is mainly used.

However, as a problem to be solved for the trench isolation technique, there are cases where, due to a thermal oxidation step for forming a gate isolation film, the thermal oxidation step being performed after the completion of a process of embedding a dielectric in a Si groove (trench groove formed on a silicon substrate), silicon on a sidewall of a trench groove is oxidized, the volume inside the Si groove increases and compression stress is applied to the silicon constituting an active region (element region), thereby a crystal defect of the silicon occurs in the vicinity of a trench groove.

For this reason, an issue such as junction leak was induced at a boundary section between a trench isolation region and an element region (activation region).

Such a crystal defect due to thermal oxidation of silicon at a sidewall of a trench groove occurs in an element region of a low voltage transistor in a semiconductor apparatus in which a large-sized high voltage transistor and a small-sized low voltage transistor are formed on the same silicon substrate.

Such a crystal defect prominently appears especially in a semiconductor apparatus having a high-density pattern, such as SRAM. When the amount of thermal oxidation is great upon forming an oxide film, for example when a gate oxide film for high voltage operation of 5 v-40 v is grown, a serious defect in LSI operation occurs, such as an increase in leak current.

As a method for avoiding such a problem, as shown in FIG. 10(a), a method of forming the nitride film 23 after the oxide film 22 is formed on a side surface of a trench formed on the silicon substrate 21 and then embedding the dielectric 24 in a trench groove is known (for example, see Patent Literature 1).

In this structure, oxidation of a sidewall of a trench groove by thermal oxidation after the formation of the trench groove is prevented by the nitride film 23, and an increase in volume in the trench groove is inhibited.

Further, aside from the issue of the above-described crystal defects, there is also an issue of an oxide film becoming thin at a boundary between a trench isolation groove and an element region (activation region). Such an issue occurs for the following reason: after an insulating film is embedded in a trench groove (FIG. 8(c)) and the oxide film 28 is removed, a stress is applied to the top corner section of the trench groove upon forming a gate oxide film by thermal oxidation of a silicon substrate surface, and due to the effect of this stress, the film thickness of the oxide film formed by thermal oxidation becomes thinner in comparison to regions other than the edge section of an element region or regions other than the edge section of an element isolation region at a boundary between the trench isolation groove and the element region (activation region). For example, a gate insulating film used in a high voltage transistor has a film thickness of 14 nm or greater. However, the film thickness becoming thin at a boundary between a trench isolation groove and an element region (activation region) not only leads to a decrease in breakdown voltage, but also causes a double threshold issue.

FIG. 9(b) is a diagram illustrating such a double threshold issue.

In other words, in a transistor having a normal threshold property, in accordance with an increase in gate voltage Vg, drain current Id smoothly rises from a predetermined gate voltage value as indicated by L1 (solid line) in the graph. In contrast, in a transistor having a double threshold property, in accordance with an increase in gate voltage Vg, drain current Id starts to rise at a gate voltage value that is lower than normal, and after the drain current is in a saturated state for a moment, the drain current starts to rise again in response to an increase in gate voltage, as indicated by L2 (dotted line) in the graph. In such a transistor having a double threshold property, linear control of drive current or the like is impossible.

CITATION LIST

Patent Literature

Patent Literature 1: Japanese Laid-Open Publication No. 2001-160589

SUMMARY OF INVENTION

Technical Problem

As explained above, oxidation of a sidewall of a trench groove by thermal oxidation after the formation of the trench groove is prevented by the nitride film 23, and an increase in volume in the trench groove is inhibited in Patent Literature 1. However, in such a formation method of a trench isolation region disclosed in Patent Literature 1, as shown in FIG. 10(b), there are cases where the film thickness of the gate oxide film 26 formed in the active region 25 becomes thin near a boundary A due to forming the nitride film 23 at the boundary A between the trench isolation region 24 and the element region (active region) 25. This issue of a gate insulating film becoming thin can be an issue more prominent than the issue of a gate insulating film becoming thin, which has been occurring in a conventional trench process.

The present invention has been conceived in view of the issues as described above. The present invention is for the purpose of providing a method of manufacturing a semiconductor apparatus that is capable of inhibiting a thick gate oxide film from becoming thin at a boundary between an element region and a trench isolation region at the time of forming the gate oxide film with a thickness to the extent such that gate breakdown voltage of a high voltage transistor can be secured in addition to being capable of preventing a crystal defect caused by oxidation of substrate material from occurring at a sidewall section of a trench isolation groove in an active region of a small-sized low voltage transistor, and electronic equipment that is equipped with a semiconductor apparatus obtained by such a method of manufacturing a semiconductor apparatus.

Solution to Problem

A method of manufacturing a semiconductor apparatus in which a plurality of semiconductor elements formed on a semiconductor substrate are isolated by a trench isolation region according to the present inventions comprises: forming a trench isolation groove on a surface of the semiconductor substrate so as to isolate an element region on which the semiconductor elements are to be formed; embedding a dielectric material in the trench isolation groove to form the trench isolation region; selectively forming an antioxidant film on the surface of the semiconductor substrate so as to cover the trench isolation region; and forming a thick thermal oxide film that is thicker than a thickness of a thermal oxide film required in a semiconductor element of a predetermined size other than the maximum size among the plurality of semiconductor elements in an element region of the semiconductor element of the predetermined size, with the antioxidant film as a mask, thereby achieving the objective described above.

Preferably in a method of manufacturing a semiconductor apparatus according to the present invention, the semiconductor apparatus comprises a high voltage semiconductor element that operates at a high voltage and a low voltage semiconductor element that operates at a low voltage as the plurality of semiconductor elements, the low voltage semiconductor element is the semiconductor element of the predetermined size, and the thick thermal oxide film has a film thickness that satisfies breakdown voltage required in the high voltage semiconductor element.

Still preferably, in a method of manufacturing a semiconductor apparatus according to the present invention, the antioxidant film is formed to stick out from the trench isolation region to overlap an element region adjacent to the trench isolation region at a predetermined amount of overlap.

Still preferably, in a method of manufacturing a semiconductor apparatus according to the present invention, an oxide layer thicker than a film thickness of a thermal oxide film required in a semiconductor element to be formed in the element region is formed under the antioxidant film in an overlap region in which the antioxidant film and the element region overlap.

Still preferably, in a method of manufacturing a semiconductor apparatus according to the present invention, forming the thermal oxide film on the element region comprises: forming a thick thermal oxide film that satisfies breakdown voltage required in the high voltage semiconductor element in both a high voltage element region in which the high voltage semiconductor element is to be formed and a low voltage element region in which the low voltage semiconductor element is to be formed after the antioxidant film has been formed; and removing the thick thermal oxide film formed in the low voltage element region to form a thin thermal oxide film that satisfies breakdown voltage required in the low voltage semiconductor element.

Still preferably, in a method of manufacturing a semiconductor apparatus according to the present invention, forming the trench isolation region comprises forming an intra-trench thermal oxide film by thermal oxidation on an inner surface of a trench isolation groove formed on a silicon substrate that is the semiconductor substrate, and forming the trench isolation region is forming a trench isolation region by embedding a dielectric material in the trench isolation groove after the intra-trench thermal oxide film has been formed.

Still preferably, in a method of manufacturing a semiconductor apparatus according to the present invention, forming the trench isolation region comprises forming a sacrificial oxide film by thermal oxidation on the inner surface of the trench isolation groove so as to absorb an etching damage on the inner surface of the trench isolation groove, and forming the trench isolation region is forming the intra-trench thermal oxide film on the inner surface of the trench isolation groove after removing the sacrificial thermal oxide film and then forming a trench isolation region by embedding a dielectric material in the trench isolation groove.

Still preferably, in a method of manufacturing a semiconductor apparatus according to the present invention, forming the trench isolation region comprises: forming a first thermal oxide film on a silicon substrate that is the semiconductor substrate; forming a first silicon nitride film on the first thermal oxide film; patterning the first silicon nitride film so as to form an opening at a section corresponding to the element region; and selectively etching the first thermal oxide film and the silicon substrate with the patterned first silicon nitride film as a mask to form the trench isolation groove.

Still preferably, in a method of manufacturing a semiconductor apparatus according to the present invention, the thick thermal oxide film that is thicker than a thickness of a thermal oxide film required in a semiconductor element of a predetermined size has a film thickness of 10 nm or greater.

Still preferably, in a method of manufacturing a semiconductor apparatus according to the present invention, the thickness of the antioxidant film is 0.02 um or greater.

Still preferably, in a method of manufacturing a semiconductor apparatus according to the present invention, the amount of overlap is 0.2 um or greater.

Still preferably, in a method of manufacturing a semiconductor apparatus according to the present invention, the high voltage semiconductor element is a high voltage MOS transistor constituting an input/output section of the semiconductor apparatus and operates at a gate voltage in a range of 5 V or higher and 40 V or lower, and the low voltage semiconductor element is a low voltage MOS transistor that operates at a gate voltage in a range of 1.2 V or higher and 3.3 V or lower.

Electronic equipment mounted with a semiconductor apparatus according to the present invention is provided, where the semiconductor apparatus is manufactured by the method of manufacturing a semiconductor apparatus according to the present invention, thereby achieving the objective described above.

The functions of the present invention will be described hereinafter.

In the present invention, thermal oxidation is performed in a state where a trench isolation region is covered with an antioxidant film when forming a thermal oxide film after forming the trench isolation region. Thus, it is possible to prevent silicon on a side surface of a trench groove in the trench isolation region from being oxidized. For this reason, it is possible to prevent compression stress from being applied to an element region due to an increase in volume in the trench groove by oxidation of the silicon on the side surface of the trench groove, thereby to prevent a silicon crystal defect from occurring in the element region in the vicinity of the trench isolation region.

Further, in the present invention, before the formation of a thermal oxide film, an oxide film with a thickness greater than that of this thermal oxide film is already formed under a portion of an antioxidant film covering the element isolation region, the portion of the antioxidant film overlapping a side section of the element region. Thus, it is possible to prevent the thermal oxide film from becoming thin at a boundary section between the trench isolation region and the element region, even if the growth of the thermal oxide film is inhibited by stress at the top corner section of the active region.

Advantageous Effects of Invention

As described above, according to the present invention, it is possible to inhibit a thick gate oxide film from becoming thin at a boundary between an element region and a trench isolation region at the time of forming the gate oxide film with a thickness to the extent such that gate breakdown voltage of a high voltage transistor can be secured, and to prevent a crystal defect caused by oxidation of substrate material at a sidewall section of a trench isolation groove from occurring in an active region of a small-sized low voltage transistor.

BRIEF DESCRIPTION OF THE DRAWINGS

FIGS. 6(a) and 6(b) are a plane view and a cross-sectional view showing a semiconductor apparatus in which an element region is isolated by the LOCOS method. FIG. 6(c) is a cross-sectional view showing a semiconductor apparatus in which element regions are isolated by the trench isolation method as a conventional semiconductor apparatus.

FIG. 9 is a diagram illustrating the issue in a conventional element isolation structure shown in FIG. 6. FIG. 9(a) is a diagram illustrating a bird's beak issue in LOCOS isolation in FIGS. 6(a) and 6(b). FIG. 9(b) is a diagram illustrating a double threshold issue in trench isolation shown in FIG. 6(c).

FIG. 10(a) shows a cross-sectional structure of the trench element isolation structure. FIG. 10(b) is a cross-sectional view illustrating the problem to be solved in the trench element isolation structure.

Figure 1:
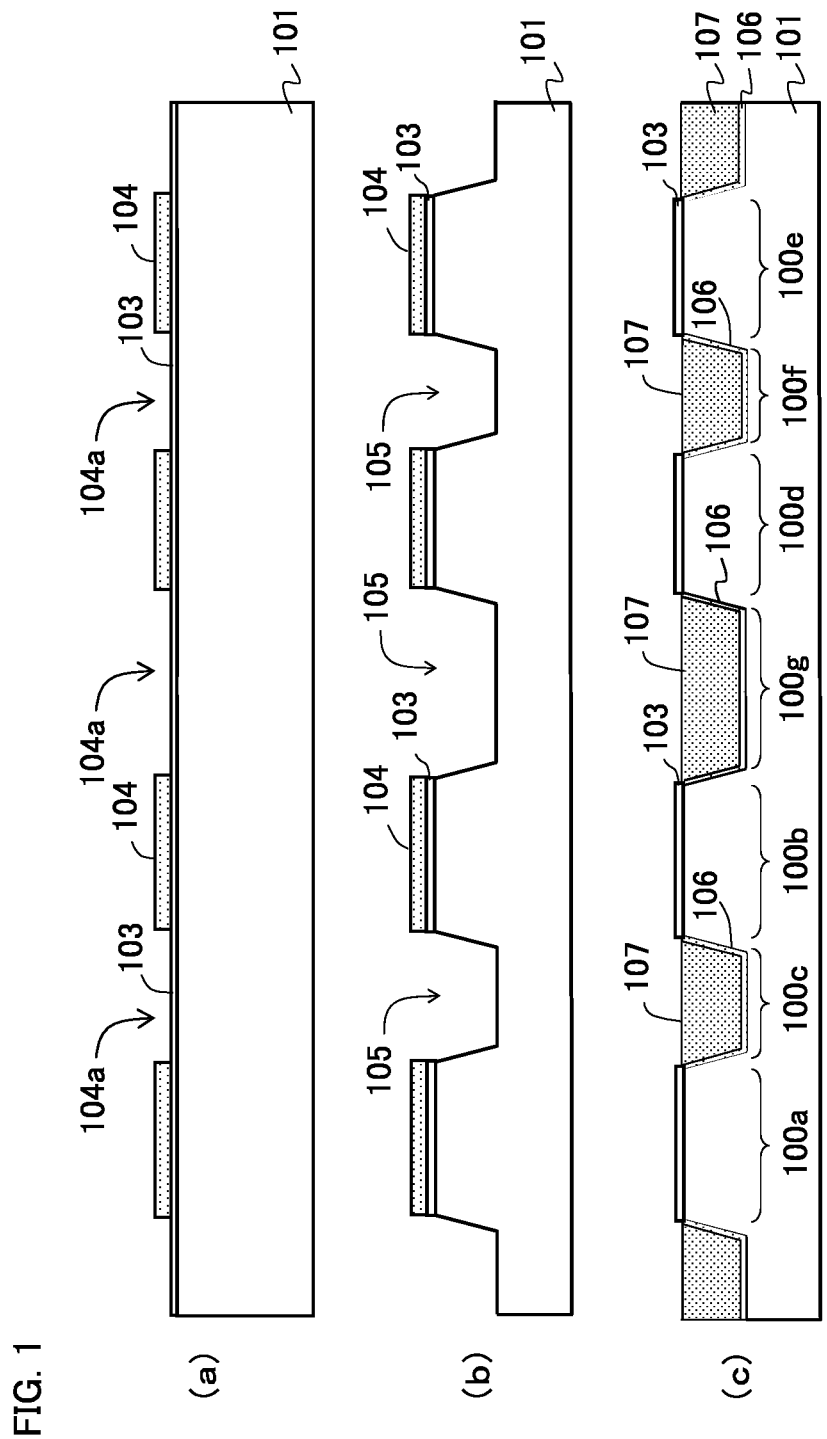
FIG. 1 is a cross-sectional view for illustrating the method of manufacturing a semiconductor apparatus according to Embodiment 1 of the present invention. Formation of an etching mask (FIG. 1(a)), formation of a trench groove (FIG. 1(b)), and embedding of a dielectric (FIG. 1(c)) are shown in the order of the steps.
Figure 2:
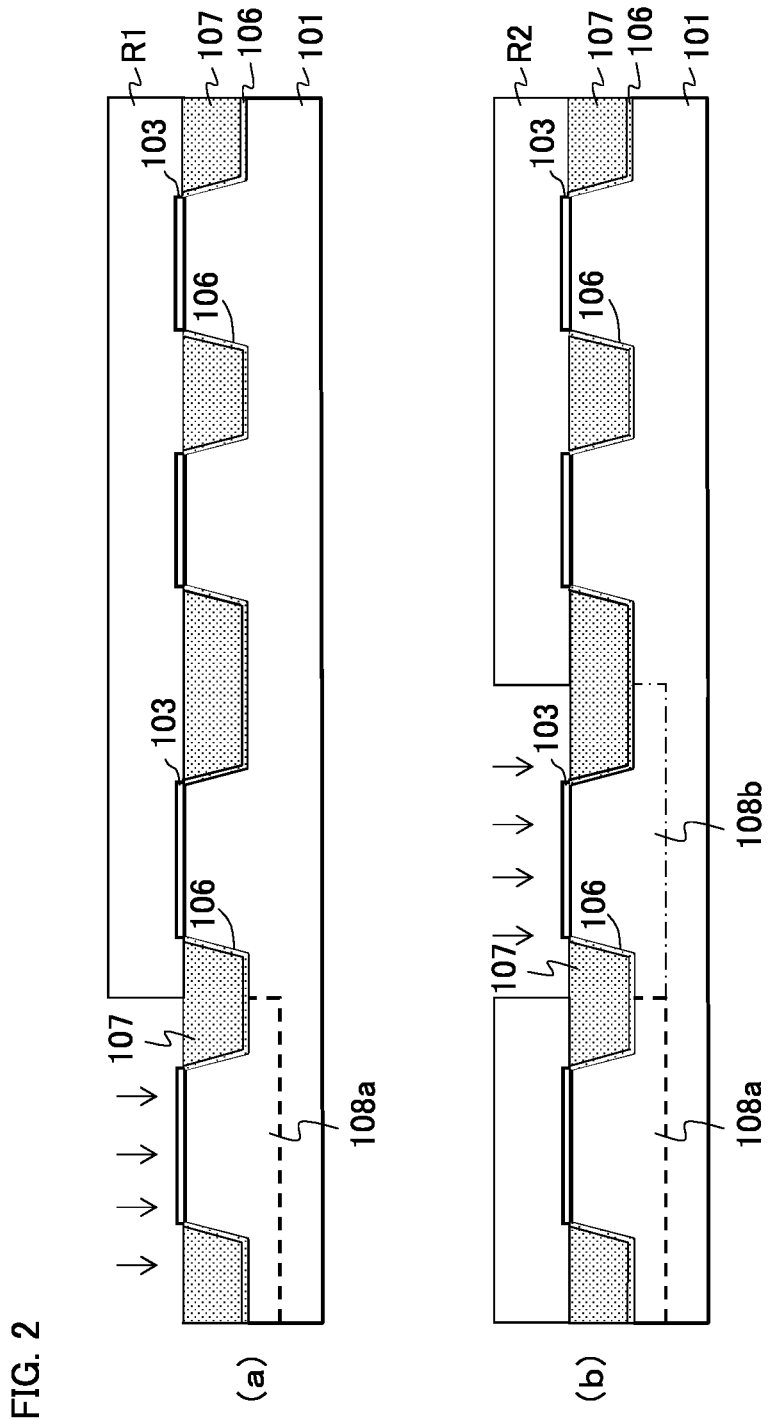
FIG. 2 is a cross-sectional view for illustrating the method of manufacturing a semiconductor apparatus according to Embodiment 1 of the present invention. Formation of a P-well (FIG. 2(a)) and formation of an N-well region (FIG. 2(b)) of a high voltage transistor are shown in the order of the steps.
Figure 3:
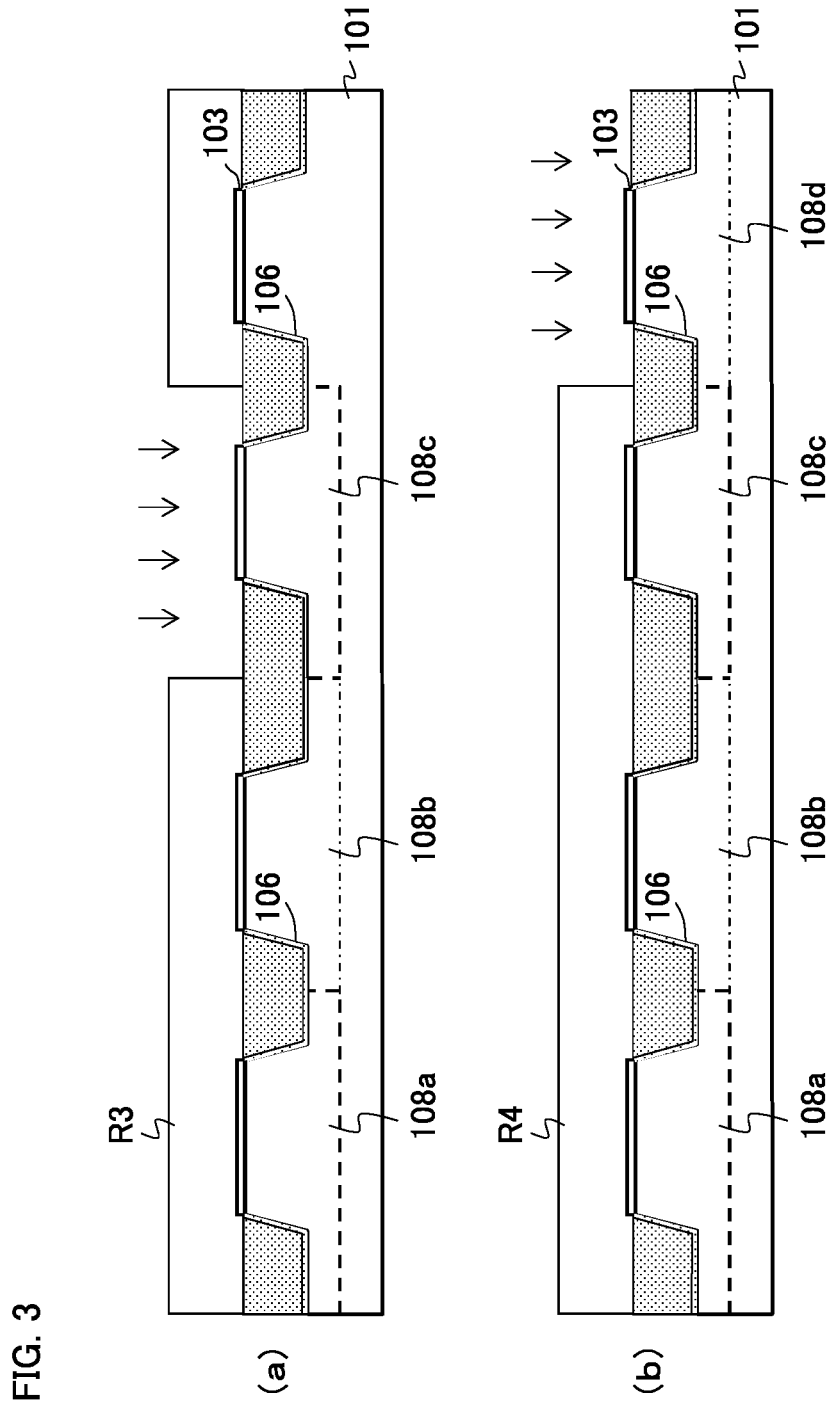
FIG. 3 is a cross-sectional view for illustrating the method of manufacturing a semiconductor apparatus according to Embodiment 1 of the present invention. Formation of a P-well (FIG. 3(a)) and formation of an N-well region (FIG. 3(b)) of a low voltage transistor are shown in the order of the steps.
Figure 4:
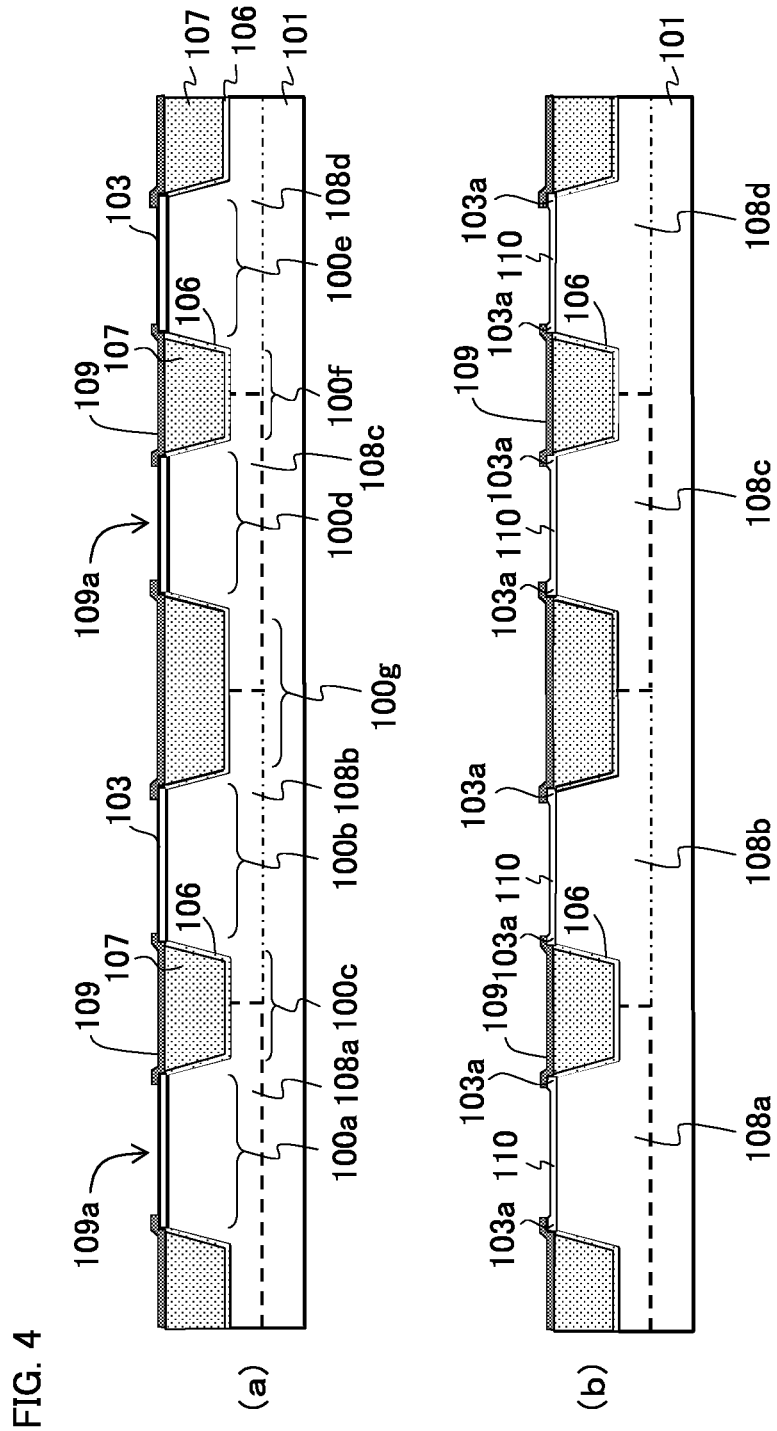
FIG. 4 is a cross-sectional view for illustrating the method of manufacturing a semiconductor apparatus according to Embodiment 1 of the present invention. Covering of a trench isolation region with a nitride film (FIG. 4(a)) and formation of a thick gate oxide film in an element region (FIG. 4(b)) are shown in the order of the steps.

REFERENCE SIGNS LIST 100 semiconductor apparatus
100a, 100b element region
100c,100f,100g trench isolation region
101 silicon substrate
103 thermal oxide film
103a thermal oxide layer
104 first silicon nitride film
105 trench groove
106 sidewall thermal oxide film
107 embedded oxide film
108a, 108c P-well region
108b, 108d N-well region
109 second silicon nitride film
110 thick thermal oxide film
110a thin thermal oxide film
111a formation region of high voltage transistor
111b formation region of low voltage transistor
112a, 112c N-type source diffusion region
112b, 112d N-type drain diffusion region
115a, 115c P-type source diffusion region
115b, 115d P-type drain diffusion region
113, 113a contact electrode
114, 114a metal wiring
116, 116a gate insulating film
117, 117a gate electrode
118, 118a sidewall
R1-R5 resist film

DESCRIPTION OF EMBODIMENTS

Figure 5:
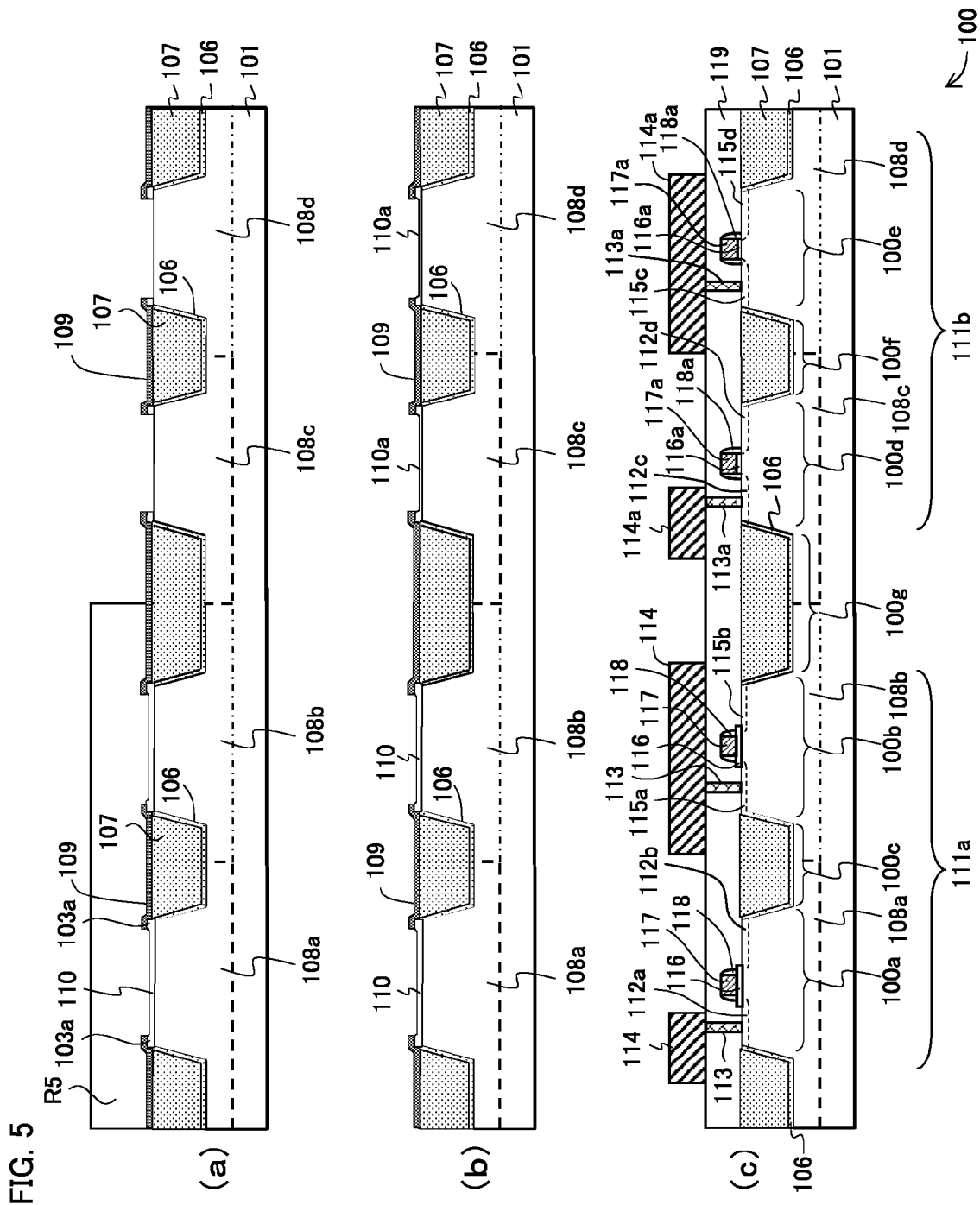
FIG. 5 is a cross-sectional view for illustrating the method of manufacturing a semiconductor apparatus according to Embodiment 1 of the present invention. Removal of a thick gate oxide film in a low voltage transistor region (FIG. 5(a)), formation of a thin gate oxide film in a low voltage transistor region (FIG. 5(b)), and formation of high voltage and low voltage transistors (FIG. 5(c)) are shown in the order of the steps.
Figure 6:
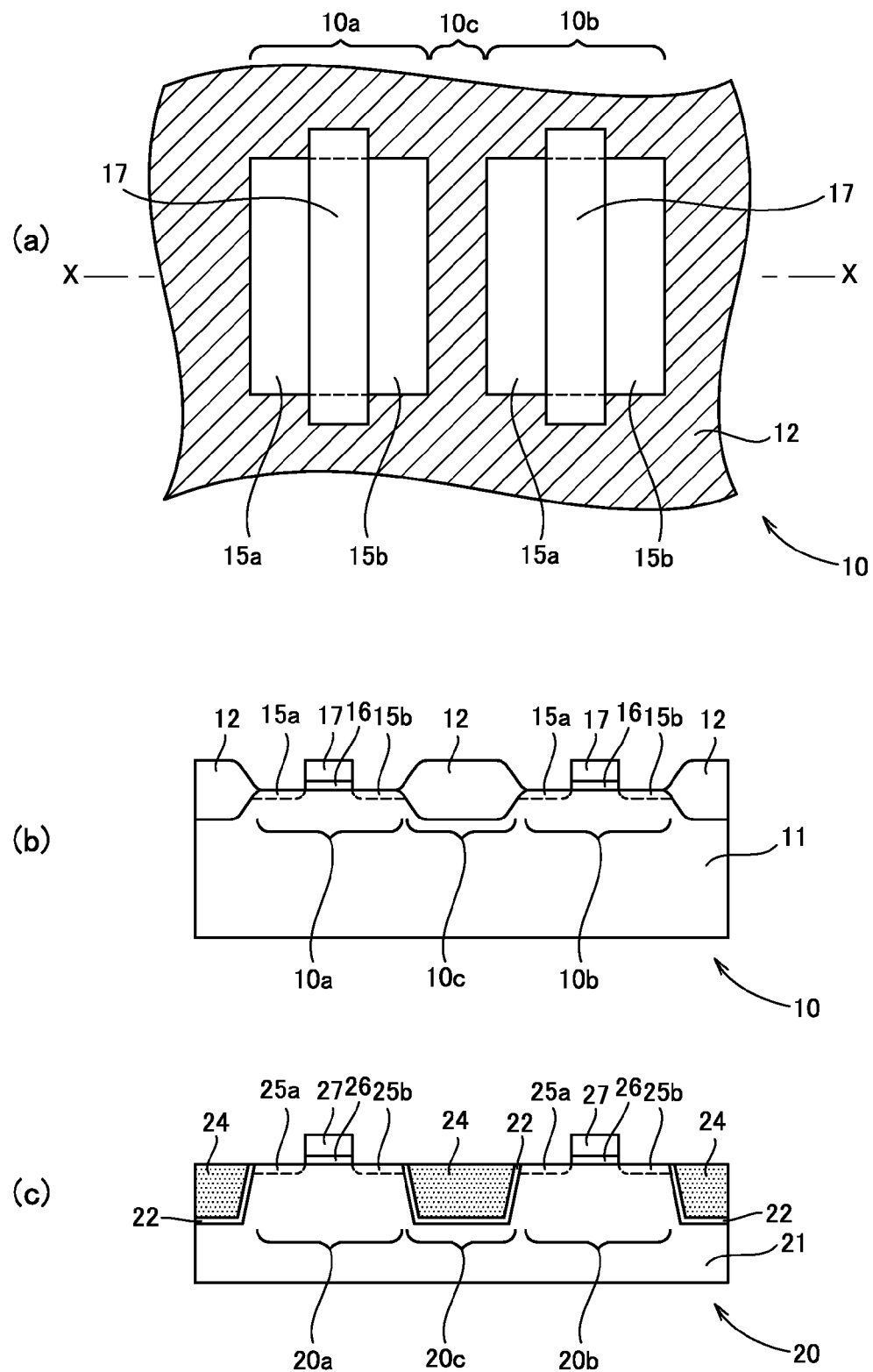
FIG. 6 is a diagram illustrating a conventional semiconductor apparatus.
Figure 7:
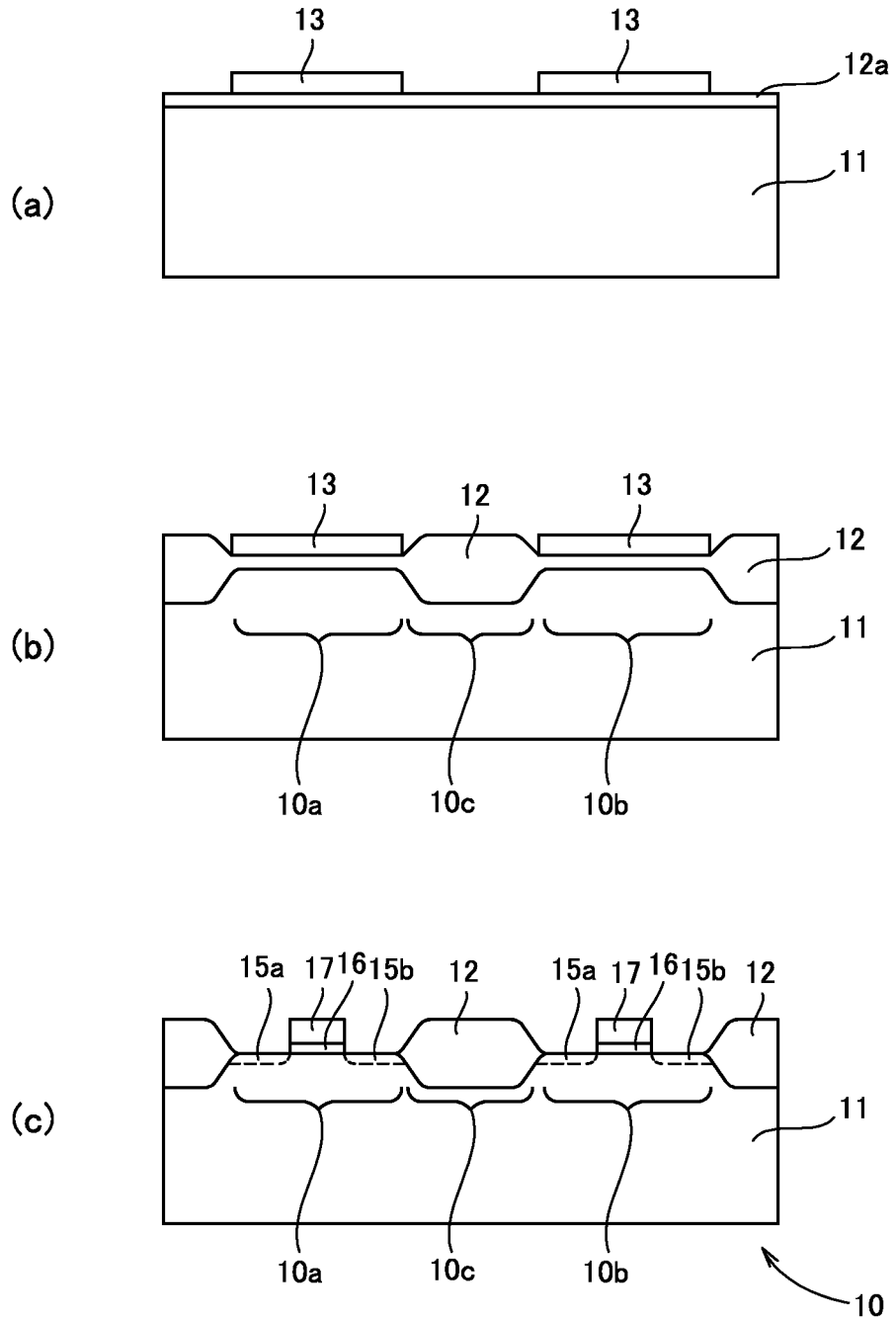
FIG. 7 is a diagram illustrating a method of manufacturing a conventional semiconductor apparatus using the LOCOS method in the order of the steps (FIGS. 7(a)-7(c)).
Figure 8:
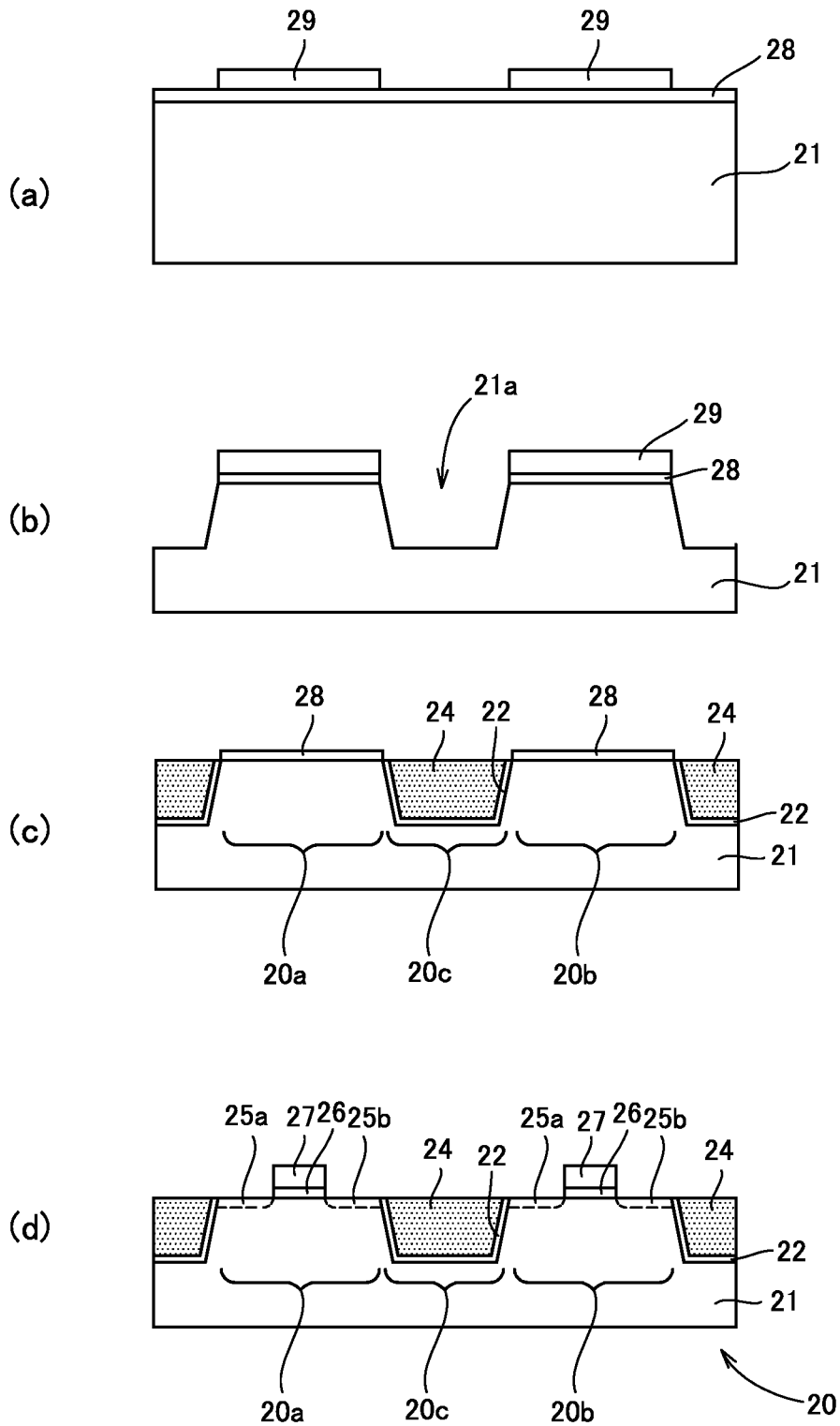
FIG. 8 is a diagram illustrating a method of manufacturing a conventional semiconductor apparatus using the trench isolation method in the order of the steps (FIGS. 8(a)-8(d)).
Figure 10:
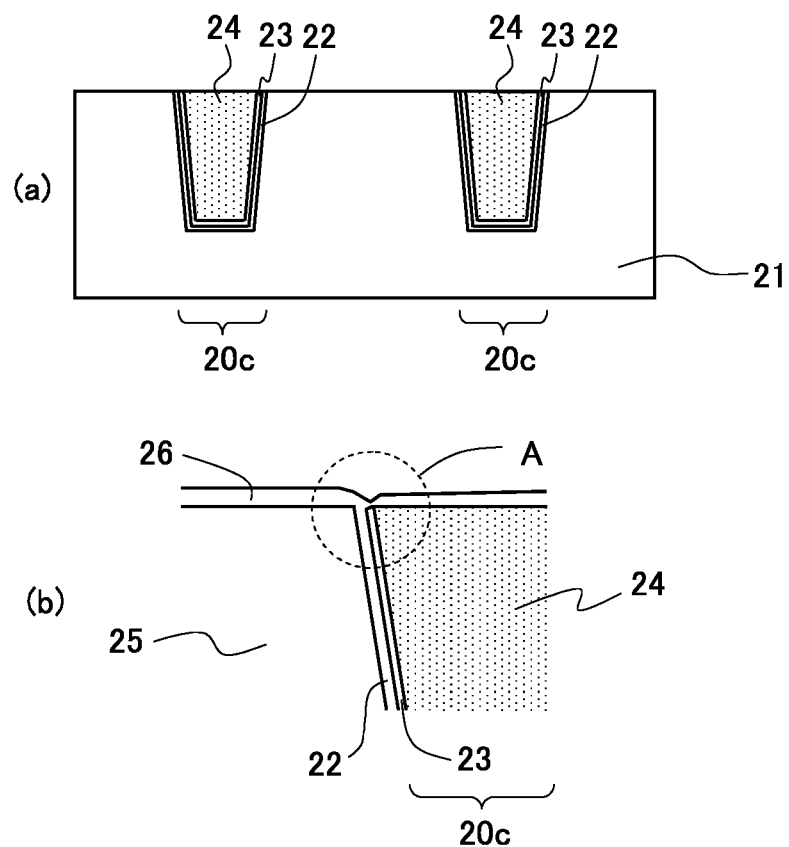
FIG. 10 is a diagram illustrating a trench element isolation structure in a semiconductor apparatus disclosed in Patent Literature 1.

Hereinafter, an embodiment of the present invention will be described in detail with reference to the attached figures.
(Embodiment 1)
FIGS. 1-5 are diagrams for illustrating the method of manufacturing a semiconductor apparatus according to Embodiment 1 of the present invention. FIG. 5(c) illustrates a cross-sectional structure of a semiconductor apparatus obtained by such a method of manufacturing a semiconductor apparatus of Embodiment 1. The plane view layout of adjacent MOS transistors in the cross-sectional structure shown in FIG. 5(c) is similar to that of adjacent transistors shown in FIG. 6(a).

This semiconductor apparatus 100 of Embodiment 1 has a transistor structure in the CMOS configuration. On a silicon substrate 101 that is used as a semiconductor substrate, P-well regions 108a and 108c and N-well regions 108b and 108d are formed. In each well region, a plurality of MOS transistors (semiconductor elements) is formed in their respective element regions 100a, 100b, 100d, and 100e.

Here, for convenience of explanation, a structure is shown in which a high voltage transistor formation region 111a and a low voltage transistor formation region 111b are isolated by a trench isolation region 100g; the P-well region 108a and the N-well region 108b are isolated by a trench isolation region 100c in the high voltage transistor formation region 111a; and the P-well region 108c and the N-well region 108d are isolated by a trench isolation region 100f in the low voltage transistor formation region 111b.

Here, each of the trench isolation regions 100g, 100c, and 100f has a structure in which an oxide film (hereinafter, also referred to as an embedded oxide film) 107 with a sidewall thermal oxide film 106 interposed therebetween is embedded in a trench isolation groove formed on a surface of the silicon substrate 101.

Further, a high voltage transistor is a MOS transistor that operates at a high voltage, and a low voltage transistor is a MOS transistor that operates at a low voltage. For example, a high voltage transistor constituting a driver circuit used in driving an LCD panel in an LCD display apparatus or the like operates at a gate voltage within a range of 5 V or higher and 40 V or lower. Further, a low voltage transistor constituting a logic circuit that supplies a control signal to such a driver circuit operates at a gate voltage within a range of 1.2 V or higher and 3.3 V or lower.

Further, in each of the element regions 100a and 100b contained in the high voltage transistor formation region 111a, a gate electrode 117 is formed with a thick gate insulating film 116 interposed therebetween. In addition, sidewalls 118 are formed on both sides of the gate electrode 117. Here, the element region 100a is formed in the P-well region 108a, and the element region 100b is formed in the N-well region 108b. In the element region 100a, an N-type source diffusion region 112a and an N-type drain diffusion region 112b are formed at sections on both sides of the gate electrode, and in the element region 100b, a P-type source diffusion region 115a and a P-type drain diffusion region 115b are formed at sections on both sides of the gate electrode. Here, the above-described thick gate insulating film 116, the gate electrode 117, the N-type source diffusion region 112a and the N-type drain diffusion region 112b constitute a high voltage N-type MOS transistor. Further, the above-described thick gate insulating film 116, the gate electrode 117, the P-type source diffusion region 115a and the P-type drain diffusion region 115b constitute a high voltage P-type MOS transistor.

Further, in each of the element regions 100d and 100e contained in the low voltage transistor formation region 111b, a gate electrode 117a is formed with a thin gate insulating film 116a interposed therebetween. In addition, sidewalls 118a are formed on both sides of the gate electrode 117a. The element region 100d is formed in the P-well region 108c, and the element region 100e is formed in the N-well region 108d.

In the element region 100d, an N-type source diffusion region 112c and an N-type drain diffusion region 112d are formed at sections on both sides of the gate electrode, and in the element region 100e, a P-type source diffusion region 115c and a P-type drain diffusion region 115d are formed at sections on both sides of the gate electrode. Here, the above-described thin gate insulating film 116a, the gate electrode 117a, the N-type source diffusion region 112c and the N-type drain diffusion region 112d constitute a low voltage N-type MOS transistor. Further, the above-described thin gate insulating film 116a, the gate electrode 117a, the P-type source diffusion region 115c and the P-type drain diffusion region 115d constitute a low voltage P-type MOS transistor.

Further, with regard to the gate length of each transistor, the gate length of a low voltage transistor is shorter than that of a high voltage transistor. In addition, with regard to the size of an element region, the element regions 100d and 100e of a low voltage transistor are smaller in comparison to the element regions 100a and 100b of a high voltage transistor.

In addition, an interlayer insulating film 119 is formed on the entire surface on the above-described element regions and the trench isolation regions. In addition, a metal wiring 114 connected to the N-type source diffusion region 112a and the P-type source diffusion region 115a in the element regions 100a and 100b via a contact electrode 113, and a metal wiring 114a connected to the N-type source diffusion region 112c and the P-type source diffusion region 115c in the element regions 100d and 100e via a contact electrode 113a are formed on the interlayer insulating film 119.

Next, such a method of manufacturing a semiconductor apparatus having a structure in which an element region is isolated by trench isolation will be explained.

A method of manufacturing a CMOS-LSI having high voltage P-type and N-type MOS transistors, which are P-type and N-type MOS transistors for operation at a voltage of 5 V or higher, and low voltage P-type and N-type MOS transistors, which are P-type and N-type MOS transistors for operation at a voltage of 1.2 V or higher will be specifically explained below in the order of the steps.

(1) First, the surface of the silicon substrate 101 is thermally oxidized to form a thermal oxide film 103 with a thickness of 20-100 nm. If a silicon nitride film for use as an etching mask is formed directly on the silicon substrate 101, a distortion will be created on the silicon substrate 101. Thus, the thermal oxide film 103 is formed to prevent such a distortion from occurring. Further, the thermal oxide film 103 is formed with a thickness greater than that of a thermal oxide film (for example, a gate oxide film of a high voltage MOS transistor) formed by thermal oxidation after the formation of a trench isolation region.

Subsequently, a first silicon nitride film 104 with a thickness of 100 nm-200 nm that is used as the above-described etching mask is deposited on the above-described thermal oxide film 103 by, for example, a CVD method, and then the first silicon nitride film 104 is etched with a photoresist layer (not shown) having a predetermined pattern as a mask to form an opening section 104a in a region that is to be a trench isolation region. The photoresist layer used for patterning is removed thereafter. Thereby, the cross-sectional structure shown in FIG. 1(a) is obtained.

(2) Next, the thermal oxide film 103 and the silicon substrate 101 are etched with the patterned first silicon nitride film 104 as a mask to form a trench groove 105 with a depth of about 0.2 um-3.0 um. Thereby, the cross-sectional structure shown in FIG. 1(b) is obtained.

(3) Next, the inner wall of the trench groove 105 is thermally oxidized to form a sidewall thermal oxide film 106 with a thickness of 5 nm-50 nm, and then an embedded oxide film 107 is deposited by a CVD method such that the trench groove 105 is completely filled with the embedded oxide film 107. The deposited oxide film 107 is then polished to flatten the surface by a CMP (Chemical Mechanical Polishing) method with the first silicon nitride film 104 as a stopper to form the trench isolation regions 100c, 100f, and 100g. Next, the first silicon nitride film 104 used as a stopper for a treatment by the CMP method is selectively removed by, for example, hot phosphoric acid. Thereby, the cross-sectional structure shown in FIG. 1(c) is obtained.

Here, although the sidewall thermal oxide film 106 is formed in the inner wall surface of the trench groove 105 after forming the trench groove 105 on the silicon substrate 101, it is desirable that the sidewall thermal oxide film 106 is formed on the inner surface of the trench groove after removing any etching damage on the inner surface of the trench groove 105. In other words, it is desirable that the above-described sidewall thermal oxide film 106 is formed on the inner surface of the trench groove after forming a sacrificial thermal oxide film by thermal oxidation on the inner surface of the trench groove so as to absorb etching damage on the inner surface of the trench groove 105 formed by etching and removing the sacrificial thermal oxide film.

(4) Next, P-well regions 108a and 108c and N-well regions 108b and 108d are formed by repeating a predetermined patterning and ion implantation with the remaining thermal oxide film 103 as a through oxide film, and an adjustment is made on a threshold (Vth) of an N-type MOS transistor and a P-type MOS transistor formed thereafter to determine a channel profile of each transistor.

Specifically, a resist film R1 having a resist opening at a region where the P-well region 108a for a high voltage N-type MOS transistor is to be formed, is formed as an ion implantation mask on the silicon substrate 101 having the cross-sectional structure shown in FIG. 1(c). Ion implantation is performed with the resist film R1 as a mask to form the P-well region 108a. Thereby, the cross-sectional structure shown in FIG. 2(a) is obtained.

(5) Subsequently, after removing the above-described resist film R1, a resist film R2 having a resist opening at a region where the N-well region 108b for a high voltage P-type MOS transistor is to be formed, is formed as an ion implantation mask on the silicon substrate 101. Ion implantation is performed to form the N-well region 108b with the resist film R2 as a mask. Thereby, the cross-sectional structure shown in FIG. 2(b) is obtained.

(6) Furthermore, after removing the above-described resist film R2, a resist film R3 having a resist opening on a region where the P-well region 108c for a low voltage N-type MOS transistor is to be formed, is formed as an ion implantation mask on the silicon substrate 101. Ion implantation is performed with the resist film R3 as a mask to form the P-well region 108c. Thereby, the cross-sectional structure shown in FIG. 3(a) is obtained.

(7) Subsequently, after removing the above-described resist film R3, a resist film R4 having a resist opening at a region, where the N-well region 108d for a low voltage P-type MOS transistor is to be formed, is formed as an ion implantation mask on the silicon substrate 101. Ion implantation is performed with the resist film R4 as a mask to form the N-well region 108d. Thereby, the cross-sectional structure shown in FIG. 3(b) is obtained.

(8) Next, after removing the above-described resist film R4, a second silicon nitride film 109 is deposited to a thickness of 20 nm-100 nm by a CVD method, the second silicon nitride film 109 is selectively etched by using a mask with a predetermined pattern, and openings 109 are formed at sections corresponding to the element regions 100a, 100b, 100d, and 100e. At this time, patterning of the second silicon nitride film 109 is performed such that the second silicon nitride film 109 covers the trench isolation regions 100c, 100f, and 100g and sticks out from the trench isolation regions 100c, 100f, and 100g to overlap the peripheral sections of the element regions 100a, 100b, 100d, and 100e that are adjacent to the trench isolation regions at a predetermined amount of overlap (width of 0.2 um). Thereby, the cross-sectional structure shown in FIG. 4(a) is obtained.

Here, the second silicon nitride film 109 acts as not only a mask for thermal oxidation processing, but also an etching mask when etching the thermal oxide film 103 exposed in the opening 109a of the second silicon nitride film 109 by dilute hydrofluoric acid processing. Thus, the film thickness of the second silicon nitride film 109 is set to function as an etching mask. In other words, if the second silicon nitride film 109 is made to be too thin, the second silicon nitride film is eliminated in the etching process of the thermal oxide film 103 and the section near the element region of the thermal oxide film 103 also becomes thin. On the other hand, if the film thickness of the second silicon nitride film 109 is made thicker than necessary, depositing by the CVD method would take time. Thus, the film thickness of the second silicon nitride film 109 is set in a suitable range as described above while considering the difference in etching rates between the silicon nitride film and the thermal oxide film 103 with respect to dilute hydrofluoric acid processing.

Further, with regard to the amount of overlap between the second silicon nitride film 109 covering the trench isolation region and the element region adjacent to the trench isolation region, if it is too large, the element region is essentially reduced, thereby inducing a decrease in the degree of integration of semiconductor elements when a semiconductor element of a predetermined size is formed. Further, if the above-described amount of overlap is too small, an oxide film with a thickness greater than that of the thermal oxide film which is used as a gate insulating film, formed under the portion of the second silicon nitride film 109 overlapping with the side section of the element region, would become an oxide film with a narrow pattern width. In this case, there is a risk that it can be difficult to prevent the film thickness of a gate oxide film formed in an element region from becoming thin near a boundary of the element region with a trench isolation region. Thus, the above-described amount of overlap is set to be suitable as described above while considering the effective use of the element region and inhibition of thinning of the film at the peripheral edge section of the element region of a gate oxide film.

(9) Next, the thermal oxide film 103 exposed in the opening 109a of the second silicon nitride film 109 is etched and removed by dilute hydrofluoric acid processing. At this time, the thermal oxide film 103 remains as a thermal oxide layer 103a under the silicon nitride film 109 at the portion of the second silicon nitride film 109 overlapping the peripheral sections of the element regions 100a, 100b, 100d, and 100e. A thermal oxide film 110 with 15 nm-60 nm of thickness, which is thinner than the above-described thermal oxide film 103 (namely, thermal oxide layer 103a) is then formed by thermal oxidation in the opening 109a of the second silicon nitride film 109 as a gate oxide film of high voltage P-type and N-type MOS transistors. Thereby, the cross-sectional structure shown in FIG. 4(b) is obtained.

The trench isolation regions 100c, 100f, and 100g are covered with the second silicon nitride film 109 upon this thermal oxidation. Thus, growth of the oxide film could not happen at the silicon sidewall surface in the trench groove, even if the substrate surface is exposed to acidic atmosphere of high temperature, which is a cause of crystal defects. Further, before the formation of the thermal oxide film 110, the oxide layer 103a with a thickness greater than that of the thermal oxide film 110 is already formed under the portion of the second silicon nitride film 109 overlapping the side section of the element region. Thus, the thermal oxide film becoming thin at the boundary section between the trench isolation region and the element region (active region) is avoided, even if growth of the thermal oxide film 110 is inhibited at the boundary by stress in the top corner section of the element region (active region).

(10) Subsequently, a resist film R5 is selectively formed so as to cover the element regions 108a and 108b where high voltage N-type and P-type MOS transistors are to be formed, and then the thermal oxide film 110 of the element regions 108c and 108d where low voltage N-type and P-type MOS transistors are to be formed is removed, with the resist film R5 as an etching mask. Thereby, the cross-sectional structure shown by FIG. 5(a) is obtained.

(11) Next, after the above-described resist film R5 is removed, a thermal oxide film 110a (film thickness 2 nm-8 nm, typically 6nm) thinner than the above-described thermal oxide film 110 is formed by thermal oxidation on the element regions 108c and 108d as a gate oxide film of low voltage N-type and P-type MOS transistors. At this time, the thermal oxide film 110 at the element regions 108a and 108b is originally a thick thermal oxide film. Thus, a major change in the thickness thereof does not occur. Thereby, the cross-sectional structure shown in FIG. 5(b) is obtained.

(12) The second silicon nitride film 109 is then selectively removed by hot phosphoric acid or the like, and a CMOS-LSI is completed by well-known techniques.

That is, the gate electrode 117 having sidewalls 118 is formed on the element region 100a in the P-well region 108a, and on the element region 100b in the N-well region 108b, with the gate insulating film 116 interposed therebetween, the P-well region 108a being a formation region of the high voltage N-type MOS transistor, the N-well region 108b being a formation region of the high voltage P-type MOS transistor. In addition, in the element region 100a in the P-well region 108a, the N-type source diffusion region 112a and the N-type drain diffusion region 112b are formed on both sides of the gate electrode. Further, in the element region 100b in the N-well region 108b, the P-type source diffusion region 115a and the P-type drain diffusion region 115b are formed on both sides of the gate electrode.

Further, the gate electrode 117a having sidewalls 118a is formed on the element region 100d in the P-well region 108c, and on the element region 100e in the N-well region 108d, with the gate insulating film 116a interposed therebetween, the P-well region 108c being a formation region of the low voltage N-type MOS transistor, the N-well region 108d being a formation region of the low voltage P-type MOS transistor. In addition, in the element region 100d in the P-well region 108c, the N-type source diffusion region 112c and the N-type drain diffusion region 112d are formed on both sides of the gate electrode. Further, in the element region 100e in the N-well region 108d, the P-type source diffusion region 115c and the P-type drain diffusion region 115d are formed on both sides of the gate electrode. Here, the gate insulating films 116 and 116a are obtained by patterning the thermal oxide films 110 and 110a so as to match the pattern of the gate electrodes 117 and 117a, respectively.

Furthermore, after the interlayer insulating film 119 is formed on the entire surface, the metal wirings 114 and 114a are formed, and the metal wiring 114 is connected to the corresponding N-type or P-type diffusion region 112a or 115a of high voltage N-type or P-type MOS transistors by the contact electrode 113 that penetrates the interlayer insulating film 119. Further, the metal wiring 114a is connected to the N-type or P-type diffusion region 112c or 115c of the corresponding low voltage N-type or P-type MOS transistors by a contact electrode 113a that penetrate the interlayer insulating film 119. Thereby, the cross-sectional structure shown in FIG. 5(c) is obtained.

An example in which each of the metal wirings 114 and 114a is connected to the source diffusion regions 112a, 112c, 115a, or 115c is shown herein. However, each of the metal wirings 114 and 114a may be connected to the drain diffusion regions 112b, 112d, 115c, or 115d.

Furthermore, a CMOS-LSI is completed as a semiconductor apparatus by performing processing that is needed thereafter in the manufacturing process of the CMOS-LSI.

In this manner, according to the method of manufacturing a semiconductor apparatus of the present Embodiment, when forming the thermal oxide film 110 having a film thickness for use as a gate insulating film of a high voltage transistor after forming the trench isolation regions 100c, 100f, and 100g on the surface region of the silicon substrate 101, thermal oxidation is performed in a state where the trench isolation regions 100c, 100f, and 100g are covered with the second silicon nitride film 109. Therefore, it is possible to prevent the silicon on the side surface of the trench grooves in the trench isolation regions 100c, 100f, and 100g from being oxidized. For this reason, it is possible to prevent compression stress from being applied to the element region due to an increase in volume in a trench groove by oxidation of silicon on the side surface of the trench groove, thereby to prevent crystal defects of silicon from occurring in a small-sized element region (namely, an element region of a low voltage transistor) near a trench isolation region.

Further, in the method of manufacturing a semiconductor apparatus of the present Embodiment, the thermal oxide layer 103a with a thickness greater than that of the thermal oxide film 110 is already formed before the formation of the thermal oxide film 110 for use as a gate insulating film of a high voltage transistor, under a portion of the second silicon nitride film 109 overlapping the side section of an element region. Thus, it is possible to prevent the thermal oxide film from becoming thin at a boundary section between the trench isolation regions 100c, 100f, and 100g and the element regions (active regions) 100a, 100b, 100d, and 100e, even if growth of the thermal oxide film 110 is inhibited at the boundary by stress in the top corner section of the element regions (active regions).

In the above-described semiconductor apparatus of the present Embodiment, a silicon substrate is used as a semiconductor substrate. However, the semiconductor substrate may be any semiconductor substrate capable of being thermally oxidized. Thus, various semiconductor substrates that are capable of achieving the purpose of the present invention can be used.

Further, in the above-described method of manufacturing a semiconductor apparatus of Embodiment 1, the cross-sectional shape of the trench groove formed on the substrate surface has a flat surface as a side surface of the trench groove and is tapered such that the width of the trench groove widens towards the front surface side of the substrate. However, the present invention is for solving the problem of silicon on a sidewall of a trench groove being oxidized at the time of thermal oxidation of a substrate surface. Thus, trench isolation regions of the present invention encompass those with various shapes in which the above-described oxidation could be a problem. For example, the cross-sectional shape of a trench groove may be those in which sidewalls of a trench is perpendicular with respect to a substrate surface. Further, sidewalls of a trench are not limited to having a flat surface, and thus may have a curved surface.

Further, in the above-described method of manufacturing a semiconductor apparatus of Embodiment 1, a silicon nitride film is used as an antioxidant film for covering a trench isolation region and the periphery thereof. However, the antioxidant film is a film for preventing silicon on a sidewall of a trench groove from being oxidized. For example, it may be any film having low permeability with respect to oxygen in open air. Thus, an antioxidant film is not limited to a silicon nitride film, and the thickness of an antioxidant film may be any thickness that can sufficiently provide an antioxidant effect. However, for example, when a silicon nitride film is used, it is preferable that the silicon nitride film has a film thickness of 20 nm or greater as described above.

Furthermore, although not specifically explained in the above-described Embodiment 1, CMOS-LSIs, which are the above-described semiconductor apparatuses of Embodiment 1, are used, for example, in an input-output section of a display panel of an LCD television. Further, they can be used in an input-output section for signals in other electronic equipment, such as a video camera, scanner, facsimile machine, or copy machine, and further in a drive control section that drives and controls a driving section of a home electronic product, or the like. In this case, a low voltage transistor constituting a logic circuit is used in a control circuit that controls the operation of a high voltage transistor constituting an input-output circuit, or the like.

Further, a case where the oxide film 110 with a thickness of about 15 nm-60 nm is formed as a gate oxide film of the above-described high voltage MOS transistor was shown. However, for example, in a high voltage transistor that operates at about 5.0 V, it is generally required that the film thickness of a gate insulating film is about 14 nm. If a thermal oxide film with a thickness of this extent is formed, a crystal defect occurs in a small-sized element region constituting a low voltage transistor that operates at about 1.8 V. Thus, for example, in an LSI, there is a risk that a crystal defect occurs by stress due to oxidation of silicon on a side surface of a trench isolation groove when forming a thermal oxide film with a film thickness of 14 nm or below in a transistor with the smallest size that constitutes a memory circuit such as a register circuit. Furthermore, there is a possibility that a crystal defect occurs in an element region of a transistor when forming a thermal oxide film with a thickness of 10 nm or greater.

As described above, the present invention is exemplified by the use of its preferred embodiment. However, the present invention should not be interpreted solely based on the embodiment described above. It is understood that the scope of the present invention should be interpreted solely based on the claims. It is also understood that those skilled in the art can implement equivalent scope of technology, based on the description of the present invention and common knowledge from the description of the detailed preferred embodiment of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a method of manufacturing a semiconductor apparatus and electronic equipment. According to the present invention, it is possible to prevent a thick gate oxide film from becoming thin at a boundary between an element region and a trench isolation region at the time of forming the gate oxide film with a thickness to the extent such that gate breakdown voltage of a high voltage transistor can be secured, and to prevent a crystal defect due to oxidation of substrate material at a sidewall section of a trench isolation groove from occurring in an active region of a small-sized low voltage transistor at the time of forming the thick gate oxide film.

The invention claimed is:

1. A method of manufacturing a semiconductor apparatus in which a plurality of semiconductor elements formed on a semiconductor substrate are isolated by a trench isolation region, comprising:
   forming a trench isolation groove on a surface of the semiconductor substrate so as to isolate element regions on which the semiconductor elements are to be formed;
   embedding a dielectric material in the trench isolation groove to form the trench isolation region;
   selectively forming an antioxidant film on the surface of the semiconductor substrate so as to cover the trench isolation region; and
   forming a thick thermal oxide film that is thicker than a thickness of a thermal oxide film required in a semiconductor element of a predetermined size other than the maximum size among the plurality of semiconductor elements in an element region of the semiconductor element of the predetermined size, with the antioxidant film as a mask, wherein
   the semiconductor apparatus comprises a high voltage semiconductor element that operate at a high voltage and a low voltage semiconductor element that operates at a low voltage as the plurality of semiconductor elements,
   the low voltage semiconductor element is the semiconductor element of the predetermined size, and
   the thick thermal oxide film has a film thickness that satisfies breakdown voltage required in the high voltage semiconductor element, wherein
   the antioxidant film is formed to stick out from the trench isolation region to overlap an element region adjacent to the trench isolation region at a predetermined amount of overlap, wherein
   an oxide layer thicker than a film thickness of a thermal oxide film required in a semiconductor element to be formed in the element region is formed under the antioxidant film in an overlap region in which the antioxidant film and the element region overlap, wherein forming the thermal oxide film on the element region comprises:
   forming a thick thermal oxide film that satisfies breakdown voltage required in the high voltage semiconductor element in both a high voltage element region in which the high voltage semiconductor element is to be formed and a low voltage element region in which the low voltage semiconductor element is to be formed after the antioxidant film has been formed; and
   removing the thick thermal oxide film formed in the low voltage element region and forming a thin thermal oxide film that satisfies breakdown voltage required in the low voltage semiconductor element.

2. A method of manufacturing a semiconductor apparatus according to claim 1, wherein forming the trench isolation region comprises:
   forming a first thermal oxide film on a silicon substrate that is the semiconductor substrate;
   forming a first silicon nitride film on the first thermal oxide film;
   patterning the first silicon nitride film so as to form an opening at a section corresponding to the element region; and
   selectively etching the first thermal oxide film and the silicon substrate with the patterned first silicon nitride film as a mask to form the trench isolation groove.

3. A method of manufacturing a semiconductor apparatus according to claim 1, wherein the thick thermal oxide film that is thicker than a thickness of a thermal oxide film required in a semiconductor element of a predetermined size has a film thickness of 10 nm or greater.

4. A method of manufacturing a semiconductor apparatus according to claim 1, wherein the thickness of the antioxidant film is 0.02 um or greater.

5. A method of manufacturing a semiconductor apparatus according to claim 1, wherein the amount of overlap is 0.2 um or greater.

6. A method of manufacturing a semiconductor apparatus according to claim 1, wherein
   the high voltage semiconductor element is a high voltage MOS transistor constituting an input/output section of the semiconductor apparatus and operates at a gate voltage in a range of 5 V or higher and 40 V or lower, and
   the low voltage semiconductor element is a low voltage MOS transistor that operates at a gate voltage in a range of 1.2 V or higher and 3.3 V or lower.

7. Electronic equipment mounted with a semiconductor apparatus, wherein the semiconductor apparatus is manufactured by the method of manufacturing a semiconductor apparatus according to claim 1.

8. A method of manufacturing a semiconductor apparatus in which a plurality of semiconductor elements formed on a semiconductor substrate are isolated by a trench isolation region, comprising:
   forming a trench isolation groove on a surface of the semiconductor substrate so as to isolate element regions on which the semiconductor elements are to be formed;
   embedding a dielectric material in the trench isolation groove to form the trench isolation region;
   selectively forming an antioxidant film on the surface of the semiconductor substrate so as to cover the trench isolation region; and
   forming a thick thermal oxide film that is thicker than a thickness of a thermal oxide film required in a semiconductor element of a predetermined size other than the maximum size among the plurality of semiconductor elements in an element region of the semiconductor element of the predetermined size, with the antioxidant film as a mask, wherein
   forming the trench isolation region comprises forming an intra-trench thermal oxide film by thermal oxidation on an inner surface of a trench isolation groove formed on a silicon substrate that is the semiconductor substrate, and wherein
   a trench isolation region is formed by embedding a dielectric material in the trench isolation groove after the intra-trench thermal oxide film has been formed, wherein
   forming the trench isolation region comprises forming a sacrificial oxide film by thermal oxidation on the inner surface of the trench isolation groove so as to absorb an etching damage on the inner surface of the trench isolation groove, and wherein
   the intra-trench thermal oxide film is formed on the inner surface of the trench isolation groove after removing the sacrificial thermal oxide film and then a trench isolation region is formed by embedding a dielectric material in the trench isolation groove.

* * * * *